(12) United States Patent
Lilje et al.

(10) Patent No.: US 10,275,000 B2
(45) Date of Patent: Apr. 30, 2019

(54) THERMALLY CONDUCTIVE CABLES

(71) Applicant: Google Inc., Mountain View, CA (US)

(72) Inventors: Joshua Norman Lilje, San Jose, CA (US); James Cooper, San Francisco, CA (US)

(73) Assignee: GOOGLE LLC, Mountain View, CA (US)

(*) Notice: Subject to any disclaimer, the term of this patent is extended or adjusted under 35 U.S.C. 154(b) by 0 days.

(21) Appl. No.: 15/257,192

(22) Filed: Sep. 6, 2016

(65) Prior Publication Data
US 2018/0067526 A1 Mar. 8, 2018

(51) Int. Cl.
G06F 1/20 (2006.01)
H05K 7/20 (2006.01)
H01L 23/367 (2006.01)
H01L 23/373 (2006.01)

(52) U.S. Cl.
CPC .......... *G06F 1/203* (2013.01); *H01L 23/3677* (2013.01); *H05K 7/2039* (2013.01); *H01L 23/3736* (2013.01)

(58) Field of Classification Search
CPC ......... G06F 1/181–1/182; G06F 1/203; H05K 7/20218–7/20381; H05K 7/20409–7/20418; H05K 7/20009–7/202; H05K 7/2039; H01L 23/367–23/3677; H01L 23/46–23/467; H01L 23/3736; H01R 2101/00; H01B 7/04
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 5,343,940 A * | 9/1994 | Jean .................... F28D 15/0241 |
| | | 165/104.33 |
| 5,390,734 A | 2/1995 | Voorhes et al. |
| 5,910,883 A | 6/1999 | Cipolla |

(Continued)

FOREIGN PATENT DOCUMENTS

| CN | 104202947 A | 12/2014 |
| CN | 104460873 A | 3/2015 |

(Continued)

OTHER PUBLICATIONS

International Search Report and Written Opinion received for PCT Patent Application No. PCT/US2017/049397, dated Nov. 3, 2017, 19 pages.

(Continued)

*Primary Examiner* — Robert J Hoffberg
*Assistant Examiner* — Razmeen Gafur
(74) *Attorney, Agent, or Firm* — Brake Hughes Bellermann LLP

(57) ABSTRACT

Techniques of managing heat within an electronic device involve routing a flexible cable or a set of flexible cables within the electronic device to deliver heat to desired locations within the electronic device. Advantageously, it is possible to distribute heat uniformly while using existing components, thus not adding significantly to cost. Furthermore, the flexible cables may be routed in any way that accomplishes it goals of distributing heat and/or electricity.

17 Claims, 5 Drawing Sheets

(56) References Cited

U.S. PATENT DOCUMENTS

| | | | | |
|---|---|---|---|---|
| 6,023,410 | A * | 2/2000 | Chu | G06F 1/203 361/679.26 |
| 6,367,509 | B1 * | 4/2002 | Bonneville | F28F 21/02 138/109 |
| 6,493,226 | B1 * | 12/2002 | Noguchi | G06F 1/203 165/104.33 |
| 6,507,488 | B1 * | 1/2003 | Cipolla | G06F 1/203 165/104.33 |
| 6,847,219 | B1 * | 1/2005 | Lesher | G01R 1/18 174/36 |
| 7,220,365 | B2 * | 5/2007 | Qu | C09K 5/14 252/70 |
| 9,450,468 | B2 * | 9/2016 | Chamberlin | H02K 5/20 |
| 9,824,794 | B1 * | 11/2017 | McNutt | H01B 11/04 |
| 9,930,774 | B2 * | 3/2018 | Boday | H01L 23/473 |
| 2002/0001176 | A1 * | 1/2002 | Shibasaki | G06F 1/203 361/679.52 |
| 2002/0030981 | A1 * | 3/2002 | Sullivan | G06F 1/184 361/829 |
| 2003/0109160 | A1 * | 6/2003 | Bertini | H01R 13/5216 439/190 |
| 2004/0085734 | A1 * | 5/2004 | Ishikawa | F28D 1/0308 361/704 |
| 2005/0083647 | A1 * | 4/2005 | Neho | G06F 1/20 361/679.08 |
| 2005/0159041 | A1 * | 7/2005 | Holliday | H01R 4/5025 439/500 |
| 2005/0168941 | A1 | 8/2005 | Sokol | |
| 2006/0171113 | A1 * | 8/2006 | Wu | G06F 1/203 361/679.26 |
| 2007/0091071 | A1 * | 4/2007 | Kimura | G06F 1/1616 345/169 |
| 2008/0054922 | A1 * | 3/2008 | Lesher | G01R 1/18 324/755.01 |
| 2008/0285217 | A1 * | 11/2008 | Nakajima | G06F 1/1616 361/679.08 |
| 2010/0182742 | A1 * | 7/2010 | Mihara | G06F 1/1616 361/679.09 |
| 2011/0235258 | A1 * | 9/2011 | Chen | G06F 1/1616 361/679.26 |
| 2013/0027886 | A1 * | 1/2013 | Crooijmans | H04M 1/0274 361/704 |
| 2013/0084757 | A1 * | 4/2013 | Keswani | H01R 4/4818 439/727 |
| 2013/0161055 | A1 * | 6/2013 | Rule | H01B 7/04 174/69 |
| 2013/0279112 | A1 * | 10/2013 | Kim | H05K 7/20154 361/692 |
| 2013/0314619 | A1 * | 11/2013 | Sugiura | H04N 5/64 348/836 |
| 2013/0335894 | A1 * | 12/2013 | Hsiu | F16M 11/08 361/679.01 |
| 2014/0009888 | A1 * | 1/2014 | MacDonald | G06F 1/1681 361/701 |
| 2014/0092542 | A1 * | 4/2014 | Nishi | G06F 1/203 361/679.06 |
| 2014/0168877 | A1 * | 6/2014 | Theobald | G06F 1/1616 361/679.26 |
| 2014/0218858 | A1 * | 8/2014 | Shelnutt | G06F 1/206 361/679.31 |
| 2014/0328018 | A1 * | 11/2014 | Tsu | G06F 1/1616 361/679.54 |
| 2015/0075837 | A1 * | 3/2015 | Welborn | H01R 43/20 174/90 |
| 2015/0171525 | A1 * | 6/2015 | Schumacher | H01R 11/11 439/809 |
| 2015/0305185 | A1 * | 10/2015 | Koser | G06F 1/1616 361/679.58 |
| 2015/0309557 | A1 * | 10/2015 | Hu | G06F 1/1626 345/659 |
| 2015/0382498 | A1 * | 12/2015 | Arnouse | G06F 11/2023 714/10 |
| 2016/0012941 | A1 * | 1/2016 | Ledwith | B65H 75/4449 174/70 R |
| 2016/0048178 | A1 * | 2/2016 | Han | G06F 1/183 361/679.31 |
| 2016/0073545 | A1 * | 3/2016 | Cravens | G06F 1/187 361/679.32 |
| 2016/0087382 | A1 * | 3/2016 | Montena | H01R 13/5804 439/579 |
| 2016/0105930 | A1 * | 4/2016 | Kiss | H05B 3/12 219/544 |
| 2016/0204556 | A1 * | 7/2016 | Lin | H01R 24/38 439/578 |
| 2016/0307669 | A1 * | 10/2016 | Tozawa | H01B 7/17 |
| 2017/0018859 | A1 * | 1/2017 | Drew | H01R 4/185 |
| 2017/0179620 | A1 * | 6/2017 | Shinohara | H01R 4/185 |

FOREIGN PATENT DOCUMENTS

| | | |
|---|---|---|
| CN | 204808896 U | 11/2015 |
| DE | 102005029477 A1 | 12/2006 |
| DE | 102008041759 A1 | 3/2010 |
| EP | 0168859 A1 | 1/1986 |
| EP | 1032250 A2 | 8/2000 |
| EP | 2722854 A2 | 4/2014 |
| JP | 2000151164 A | 5/2000 |
| JP | 2010244369 A | 10/2010 |

OTHER PUBLICATIONS

Combined Search and Examination Report under Sections 17 and 18(3) for United Kingdom Application No. 1714023.7, dated Feb. 20, 2018, 10 pages.

* cited by examiner

200 ⟶

> Route a set of flexible cables along a path within an electronic device that includes a set of electronic elements, at least one of the set of flexible cables having, at a location along the path, a connection to at least one of the set of electronic elements, each of the set of flexible cables being configured to transport heat from a heat source of the electronic device to a heat sink of the electronic device along thermally conductive elements of each of the set of flexible cables, the heat sink being distinct from each of the set of electronic elements.   202

FIG. 2

THERMALLY CONDUCTIVE CABLES

TECHNICAL FIELD

This description relates to heat transport within electronic devices.

BACKGROUND

Electronic devices such as laptop computers and tablet computers generate a significant amount of heat. Typically, the heat generated by a device is emitted out of the body of the device in the vicinity of a heat-generating component (e.g., a CPU).

SUMMARY

In one general aspect, an electronic device can include a heat source, a heat sink, a set of electronic elements different from the heat source and the heat sink, and a set of flexible cables (i) configured to transport heat from the heat source to the heat sink and (ii) configured to be routed along a path that includes at least one of the set of electronic elements, each of the set of flexible cables comprising thermally conductive elements along which heat from the heat source flows to the heat sink.

The details of one or more implementations are set forth in the accompanying drawings and the description below. Other features will be apparent from the description and drawings, and from the claims.

BRIEF DESCRIPTION OF THE DRAWINGS

FIG. 2 is a flow chart that illustrates an example method of implementing the improved techniques shown in FIG. 1.

DETAILED DESCRIPTION

As mentioned above, conventional techniques of managing heat within an electronic device involve emitting heat out of the body of the electronic device in the vicinity of the heat-generating mechanism. In this way, however, the electronic device will have heat poorly distributed over its body. For example, a laptop generates heat in its base near its CPU, leaving the display cold. It is desirable to distribute heat throughout a device more uniformly. A uniformly-heated device may use less power and is more comfortable for the user.

In accordance with the implementations described herein and in contrast with the above-described conventional techniques of managing heat generated within an electronic device, improved techniques involve routing a continuous flexible cable or a set of continuous flexible cables within an electronic device to deliver heat to desired locations within the device. Advantageously, it is possible to distribute heat uniformly while using existing components, thus not adding significantly to cost. Furthermore, the flexible cables may be routed in any way that accomplishes the goals of distributing heat and/or electricity.

Figure 1:
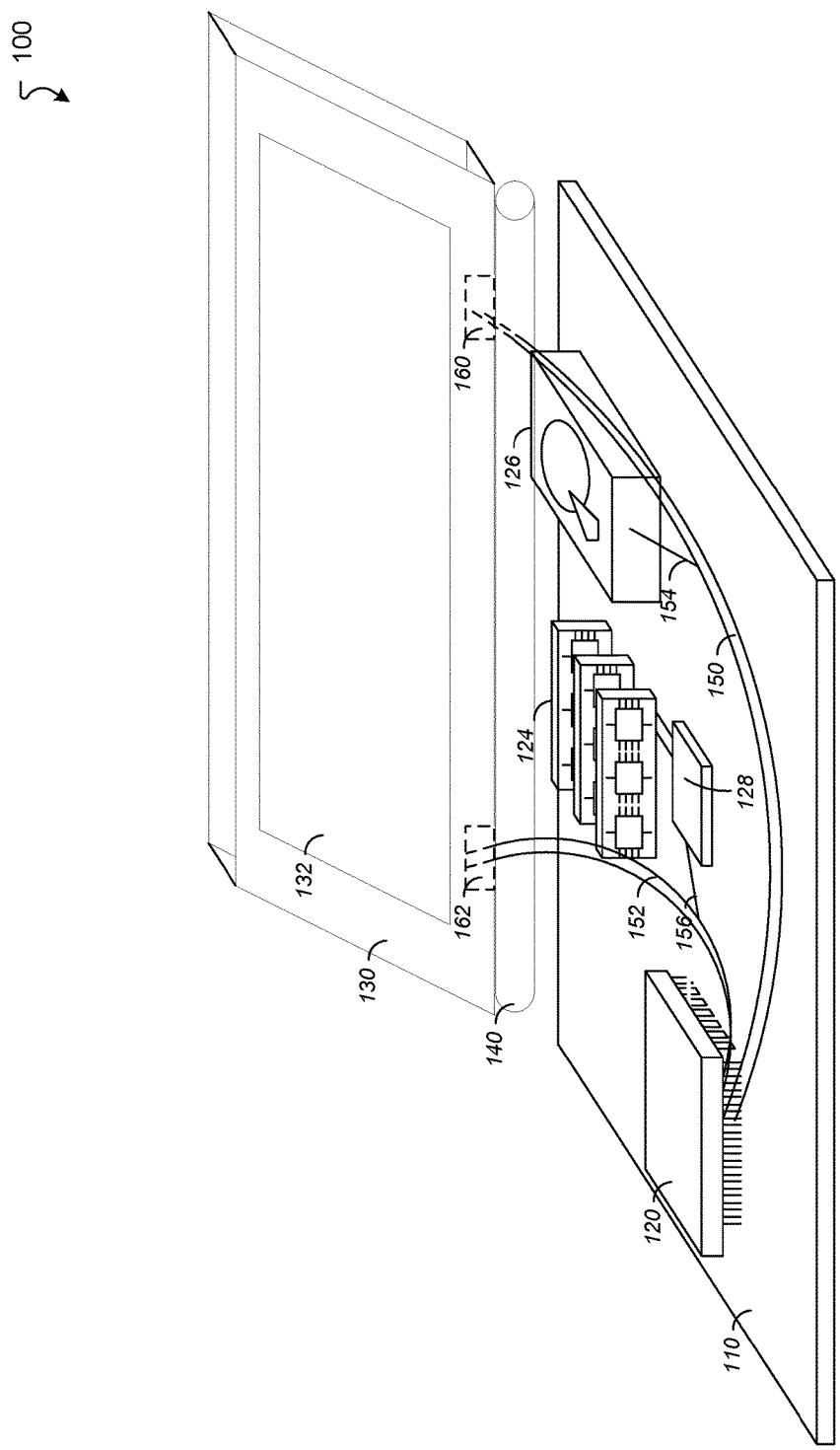
FIG. 1 is a diagram that illustrates an example electronic device in which improved techniques described herein may be implemented.

FIG. 1 is a diagram that illustrates an example electronic device 100 in which the above-described improved techniques may be implemented. As shown, in FIG. 1, the example electronic device 100 is a laptop computer having a base 110, a monitor 130, and a hinge element 140 about which the monitor 130 may rotate about the base 110. However, in other implementations, the electronic device 100 may take the form of a tablet computer, a desktop computer, a smartphone, and the like.

The base 110 of the electronic device 100 includes several components for operating the electronic device 100. For example, the base 110 includes a processor 120, memory 124, a storage device 126, and a high-speed controller 128 connecting to memory 124. There may be other components in the base 110, but these are not necessary to demonstrate the improved techniques. As described herein, these components may be connected via flexible cables such as flexible cables 150 and 152.

The processor 120 can process instructions for execution within the electronic device 100, including instructions stored in the memory 124 or on the storage device 126 to display graphical information for a GUI on an external input/output device, such as the display 132 on the monitor 130.

The memory 124 stores information within the electronic device 100. In one implementation, the memory 124 is a volatile memory unit or units. In another implementation, the memory 124 is a non-volatile memory unit or units. The memory 124 may also be another form of computer-readable medium, such as a magnetic or optical disk.

The storage device 126 is capable of providing mass storage for the computing device 100. In one implementation, the storage device 126 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 124, the storage device 126, or memory on processor 120.

The high speed controller 128 manages bandwidth-intensive operations for the electronic device 100. In one implementation, the high-speed controller 128 is coupled to memory 124 and display 126 (e.g., through a graphics processor or accelerator), and to high-speed expansion ports 610, which may accept various expansion cards (not shown). In the implementation, a low-speed controller (not pictured) is coupled to the storage device 126.

The monitor 130 includes a display 132. The display 132 is configured to display graphical information for, e.g., a GUI generated by the processor 120.

The hinge 140 is configured to connect the base 110 and the monitor 130 so that the monitor 130 may be rotated about the base 110. As depicted in FIG. 1, the hinge 140 is also configured to provide space for the flexible cables 150 and 152 to pass through from the base 110 to the monitor 130 without exposure to space external to the electronic device 100.

It should be appreciated that much of the heat generated within the electronic device 100 is generated by the processor 120. To this effect, the flexible cables 150 and 152 are configured to transport the heat generated by the processor 120 to heat sinks 160 and 162 within the monitor 130. In this way, the heat generated within the electronic device 100 is no longer just confined to one region within the base (i.e., in the vicinity of the processor 120), but can be distributed over a wider area within the electronic device 100, in this case throughout both the base 110 and the monitor 130.

It should also be appreciated that one or more of the heat sinks 160 and/or 162 may be located in a region of the electronic device 100 that is not in the monitor 130. In fact, a heat sink, e.g., heat sink 150 may be located in any void region of the monitor 130 or base 110 that is free of components and sufficiently far from the processor 120. The heat sinks 160 and 162 (and any others) may be placed within the electronic device in any region so that the heat generated by the heat source may be distributed throughout the device 100 or even uniformly distributed throughout the base 110.

It should also be appreciated that the flexible cables 150 and 152 may be cables different from conventional cables in that they are continuously run between the heat source, electrical component(s), and the heat sink. Such conventional cables provide electrical connections between the components within the electronic device 100 in a discontinuous manner, e.g., run between pairs of components. However, in addition to the electrical connections 154 and 156 shown in FIG. 1 (to, respectively, the storage device 126 and the high speed controller 128, which in turn in connected to the memory 124), the flexible cables 150 and 152 provide continuous thermal connections between a heat source (i.e., the processor 120) and the heat sinks 160 and 162.

It should also be appreciated that, while FIG. 1 depicts the flexible cables 150 and 152 as being routed through the hinge 140, in some implementations the flexible cables 150 and 152 may not be routed through the hinge 140. In such a case the heat sink 160 and 162 may be located away from the monitor 130.

It is noted that some conventional electronic devices distribute heat generated internally via heat pipes. Heat pipes can distribute heat via phase changes of a liquid, e.g., heating the liquid to produce vapor at one end of the pipes, and cooling the vapor to produce liquid at another end of the pipes. However, heat pipes are limited spatially, in that heat pipes are designed to operate within a plane normal to a gravitational field, and therefore are not suitable for use in a portable device or for transferring heat in out of a plane. In this way, the heat pipes are limited to dissipating heat within an electronic device. Electrical connections between components must still be provided by cables or high/low-speed buses.

In contrast, the improved technique described herein uses the continuous connections provided by flexible cables, e.g., flexible cables 150 and 152, to provide thermal connections between heat source and heat sink as well as electrical connections between components. Because the components may have different sizes and may be laid out in arbitrary locations within the electronic device 100, the flexible cables 150 and 152 can operate in three-dimensional space rather than being confined to a plane. Furthermore, the flexible cables 150 and 152 may also transport heat to or from the components.

FIG. 2 illustrates a method 200 of managing heat generated within an electronic device. The method 200 may be performed by an assembler of an electronic device, e.g., the electronic device 100 (FIG. 1).

At 202, a set of flexible cables are routed along a path within an electronic device that includes a set of electronic elements. At least one of the set of flexible cables has, at a location along the path, a connection to at least one of the set of electronic elements. Each of the set of flexible cables is configured to transport heat from a heat source of the electronic device to a heat sink of the electronic device along thermally conductive elements of each of the set of flexible cables. The heat sink is distinct from each of the set of electronic elements.

Figure 3:
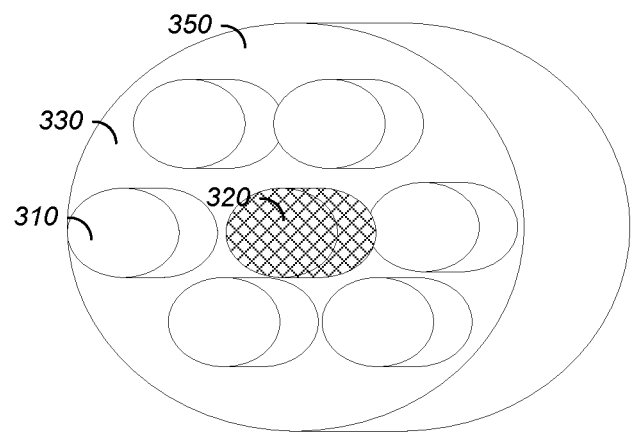
FIG. 3 is a diagram that illustrates an example flexible shown in FIG. 1.

FIG. 3 illustrates an arrangement of the improved techniques described herein in the form of an example flexible cable 350. The example flexible cable 350 includes thermally conductive wires 310 interior to the flexible cable 350. The example flexible cable 350 also includes one or more electrically conductive wires 320 in addition to the thermally conductive wires. However, in some implementations, the flexible cable 350 may include only thermally conductive wires made from, e.g., graphite, graphene, or other materials that are not necessarily electrically conductive.

It should be noted that the flexible cable 350 illustrated in FIG. 1 may be formed from a cable originally used to form electrical connections between components of an electronic device, e.g., the electronic device 100. Thus, the improved techniques discussed herein may be accomplished at very low cost using materials already in conventional use. In effect, the thermally conductive wires 310 may be added to such an existing cable providing electrical connections between components of an electronic device to form the flexible cable 350.

Examples of materials used in the thermally conductive wires include strands of copper, graphite, or graphene. Such materials may have a thermal conductivity in the range of about 0.1 W/(m K) to about 2000 W/(m K). (W=Watt, m=meter, K=Kelvin unit of absolute temperature.) Configured as such, the flexible cable 350 may deliver heat to heat sinks at the rate of about 0.1 W to about 100 W.

As depicted in FIG. 3, the flexible cable 350 also has in its interior thermal insulation 330. The thermal insulation 330 prevents heat from flowing out of the thermally conductive wires 310 into either other thermally conductive wires 310 or the one or more electrically conductive wires 320. Furthermore, the thermal insulation 330 may prevent heat from escaping the exterior of the flexible cable 350.

It should be appreciated that any of the thermally conductive wires 310 or electrically conductive wires 320 may be connected to any of the heat source (e.g., the processor 120 in FIG. 1) and/or the components of an electronic device (e.g., the storage device 126 or the high-speed controller 128 in FIG. 1). Thus, in some arrangements, the flexible cable 30 may function both as a heat transporter from a heat source and an electrical connection between the heat source and another component, e.g., to send computation results to disk. To accomplish this, those wires 310 and/or 320 may be connected thermally and/or electrically with an exterior of the flexible cable 350. The exterior of the flexible cable 350 may then include other such wires that ultimately connect to the components.

It should also be appreciated that the thermally conductive wires 310 may extend beyond any exterior of the flexible cable 350. Such an arrangement may be advantageous in providing an optimal thermal connection between a heat source and a heat sink within an electronic device.

Figure 4:
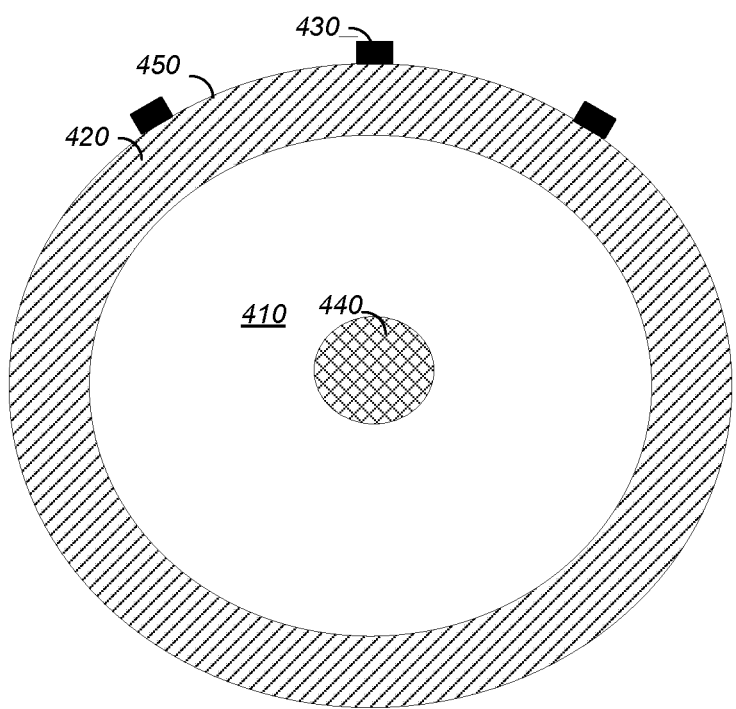
FIG. 4 is a diagram that illustrates another example flexible shown in FIG. 1.

FIG. 4 illustrates an arrangement of the improved techniques described herein in the form of an example flexible cable 450. The example flexible cable 450 includes an interior 410 and a thermally conductive jacket 420 attached circumferentially about the interior 410. The flexible cable 450 also includes thermally conductive wires 430 attached to the exterior of the jacket 420. The example flexible cable 450 also includes one or more electrically conductive wires 320 in addition to the thermally conductive wires. However, in some implementations, the flexible cable 350 may include only thermally conductive wires.

The interior 410 of the flexible cable 450 may contain thermal and/or electrical insulation to resist excess heat from entering from the exterior. Also, the interior 410 contains at least one electrically conductive wire 440. In other implementations, the interior 410 may also contain thermally conductive wires. Such an implementation will be discussed below with respect to FIG. 5.

The jacket 420 of the flexible cable 450 is made from a thermally conductive material so that heat from a heat source may flow along the exterior of the flexible cable 450. For example, the jacket 450 may be constructed from a copper sheet, a graphite sheet, a gold sheet, and/or combinations of the above or any other thermally conductive material.

As depicted in FIG. 4, the example flexible cable 450 includes thermally conductive wires 430 attached to the jacket 420. The thermally conductive wires 430 are made from the same material as the jacket 420 so as to prevent warping of the jacket 420 and the flexible cable 450 due to unmatched thermal expansion coefficients. The thermally conductive wires 420 carry heat from a heat source to the jacket 420 and from the jacket 420 to a heat sink.

Figure 5:
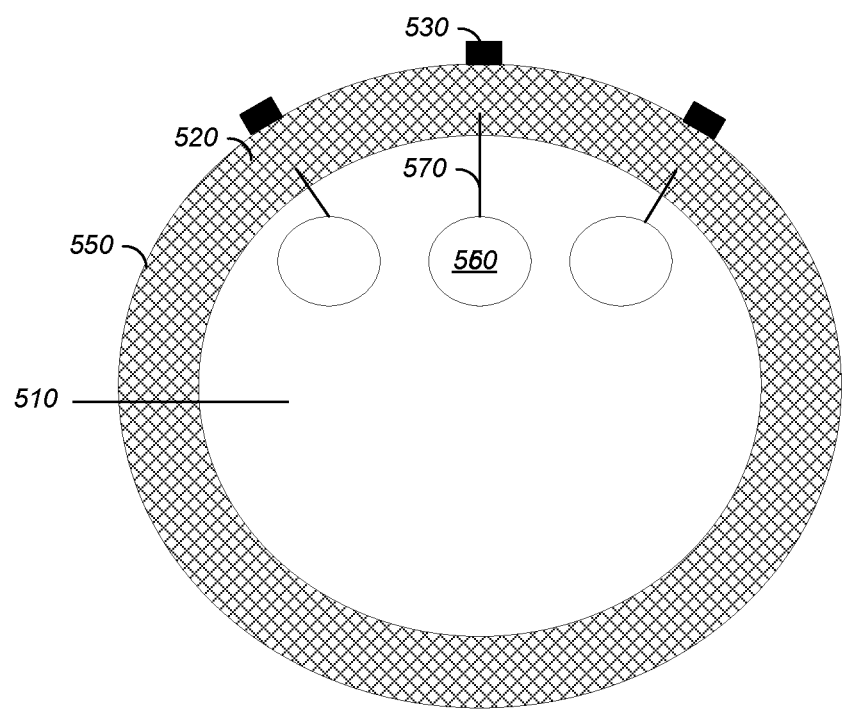
FIG. 5 is a diagram that illustrates another example flexible shown in FIG. 1.

FIG. 5 illustrates an example flexible cable 550 that is a hybrid of the flexible cables 350 and 450 illustrated respectively in FIGS. 3 and 4. The flexible cable 550 includes an interior 510 in which there are thermally conductive wires 560 and a jacket 520 attached circumferentially about the interior 510.

The interior 510 of the flexible cable 550 may contain insulation (not pictured) to resist heat flow within the interior 510. The interior 510, as depicted in FIG. 5, contains thermal conductors 570 connecting each of the thermally conductive wires 560 to the jacket 520. In this way, the jacket 520 may provide a heat sink for an electronic device. Advantageously, such a heat sink on and/or within the flexible cable 550 provides additional freedom to route the flexible cable 550 anywhere within an electronic device.

Figure 6:
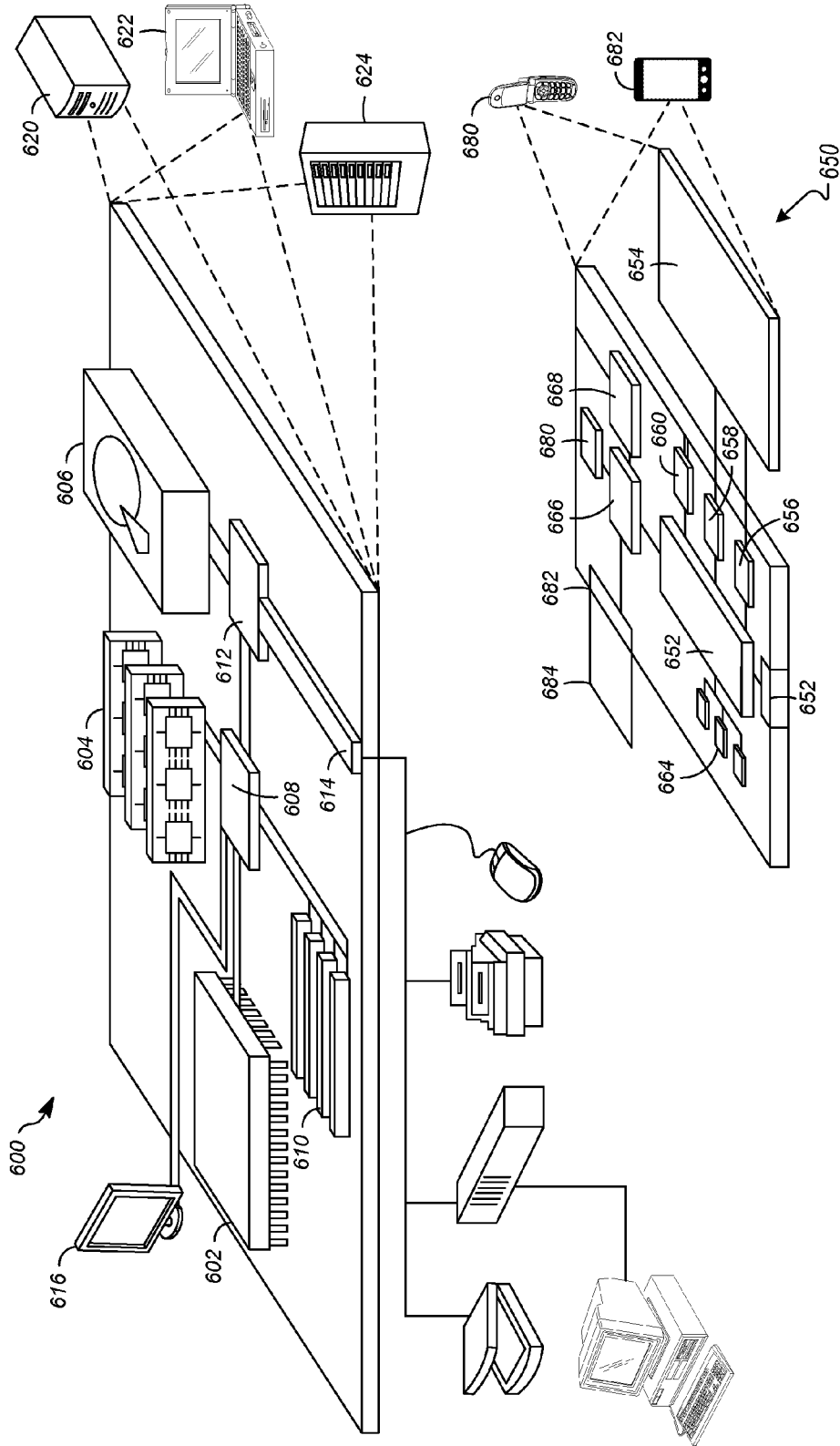
FIG. 6 illustrates an example of a computer device and a mobile computer device that can be used with circuits described here.

FIG. 6 illustrates an example of a generic computer device 600 and a generic mobile computer device 650, which may be used with the techniques described here.

As shown in FIG. 6, computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 500, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 506 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provided in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provided as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or subcombinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. An electronic device, comprising:
   a heat source;
   a heat sink;
   a set of electronic elements different from the heat source and the heat sink; and
   a set of flexible cables (i) configured to transport heat from the heat source to the heat sink and (ii) configured to be routed along a path that includes at least one of the set of electronic elements, each of the set of flexible cables being continuous and comprising thermally conductive elements along which heat from the heat source flows to the heat sink;
   wherein each of the set of flexible cables includes, as the thermally conductive elements, thermally conductive strands exterior to and connected to that flexible cable;
   wherein the thermally conductive strands exterior to and connected to that flexible cable are disposed exterior to a jacket surrounding the set of flexible cables.

2. The electronic device as in claim 1, wherein each of the set of flexible cables includes, as the thermally conductive elements, thermally conductive wires interior to that flexible cable.

3. The electronic device as in claim 2, wherein each of the set of flexible cables further includes electrically conductive wires interior to that flexible cable.

4. The electronic device as in claim 2, wherein the thermally conductive wires include at least one of copper strands, graphite strands, and graphene strands.

5. The electronic device as in claim 2, wherein a thermal conductivity of the thermally conductive wires is in the range of about 0.1 W/(m K) to about 2000 W/(m K).

6. The electronic device as in claim 2, wherein the thermally conductive wires are configured to deliver the heat at a rate of about 0.1 W to about 10 W.

7. The electronic device as in claim 1, wherein the thermally conductive strands exterior to and connected to that flexible cable include at least one of copper strands, graphite strands, and gold strands.

8. The electronic device as in claim 1, wherein the heat source includes processing circuitry, and
   wherein one of the set of electronic elements includes a memory device.

9. The electronic device as in claim 8, wherein the heat sink is located in a void region of the electronic device that contains none of the heat source and the set of electronic elements.

10. The electronic device as in claim 8, wherein the electronic device is a laptop computer having a base, a monitor, and a hinge, the base including the processing device and the memory device,
    wherein the heat sink is located in the monitor, and
    wherein at least one of the set of flexible cables is routed in a path through the hinge to the monitor.

11. An electronic device, comprising:
    a heat source;
    a heat sink;
    a set of electronic elements different from the heat source and the heat sink; and
    a set of flexible cables (i) configured to transport heat from the heat source to the heat sink and (ii) configured to be routed along a path that includes at least one of the set of electronic elements, each of the set of flexible cables being continuous and comprising thermally conductive elements along which heat from the heat source flows to the heat sink;
    wherein each of the set of flexible cables includes, as the thermally conductive elements, first thermally conductive strands interior to that flexible cable and second thermally conductive strands exterior to and connected to that flexible cable;
    wherein the second thermally conductive strands exterior to and connected to that flexible cable are disposed exterior to a jacket surrounding the set of flexible cables.

12. The electronic device as in claim 11, wherein at least one of the first thermally conductive strands of one of the set of flexible cables is connected to at least one of the second thermally conductive strands of that flexible cable, and wherein the heat sink is located in the exterior of the flexible cable.

13. A method, comprising:

routing a set of flexible cables along a path within an electronic device that includes a set of electronic elements, at least one of the set of flexible cables having, at a location along the path, a connection to at least one of the set of electronic elements, each of the set of flexible cables being continuous and configured to transport heat from a heat source of the electronic device to a heat sink of the electronic device along thermally conductive elements of each of the set of flexible cables, the heat sink being distinct from each of the set of electronic elements;

wherein the method further comprises:

providing, as thermally conductive elements, thermally conductive wires interior to that flexible cable;

providing, as additional thermally conductive elements, thermally conductive strands exterior to and connected to that flexible cable, wherein the additional thermally conductive strands exterior to and connected to that flexible cable are disposed exterior to a jacket surrounding the set of flexible cables; and connecting at least one of the thermally conductive wires interior to one of the set of flexible cables to at least one of the thermally conductive wires exterior to that flexible cable, the heat sink being located in the exterior of that flexible cable.

14. The method as in claim 13, wherein providing the thermally conductive wires interior to each of the set of flexible cables includes forming the wires from at least one of copper strands, graphite strands, and graphene strands.

15. The method as in claim 13, wherein the heat source includes processing circuitry, wherein one of the set of electronic elements includes a memory device, wherein each of the set of flexible cables includes electrically conductive wires interior to that flexible cable, and wherein routing the set of flexible cables along a path within the electronic device includes connecting an electrically conductive wire of at least one of the set of flexible cables to the memory device.

16. The method as in claim 13, wherein the heat sink is located in a void region of the electronic device that contains none of the heat source and the set of electronic elements, and wherein routing the set of flexible cables along a path within the electronic device includes placing a terminal end of at least one of the set of flexible cables in the void region of the electronic device.

17. The electronic device as in claim 1, wherein the jacket includes a thermally conductive material.

* * * * *